United States Patent [19]
Ho et al.

[11] Patent Number: 5,577,268
[45] Date of Patent: Nov. 19, 1996

[54] RADIO FREQUENCY SHIELD CLIP SUITABLE FOR USE IN A COMMUNICATION DEVICE

[75] Inventors: Norman Ho, Chicago; Mark Schwartz, Wauconda; Michael L. Charlier, Arlington Heights, all of Ill.

[73] Assignee: Motorola, Inc., Schaumburg, Ill.

[21] Appl. No.: 489,205

[22] Filed: Jun. 9, 1995

Related U.S. Application Data

[63] Continuation of Ser. No. 23,995, Feb. 26, 1993, abandoned.
[51] Int. Cl.$^6$ .................................................. H04B 1/38
[52] U.S. Cl. ........................... 455/90; 455/300; 361/800; 361/818
[58] Field of Search ........................... 455/90, 300, 301, 455/347, 349; 174/35 R, 35 MS; 361/799, 800, 816, 818; 439/37, 79

[56] References Cited

U.S. PATENT DOCUMENTS

| | | | |
|---|---|---|---|
| 4,041,399 | 8/1977 | Tsuda | 455/301 |
| 4,808,115 | 2/1989 | Norton et al. | 439/79 |
| 4,890,199 | 12/1989 | Beutler | 455/300 |
| 5,150,282 | 8/1992 | Tomura et al. | 455/300 |
| 5,152,693 | 10/1992 | Matsui et al. | 439/37 |
| 5,187,648 | 2/1993 | Ito | 361/816 |
| 5,235,492 | 8/1993 | Humbert et al. | 361/818 |
| 5,267,125 | 11/1993 | Liu | 361/816 |
| 5,353,201 | 10/1994 | Maeda | 361/818 |
| 5,354,951 | 10/1994 | Lange, Sr. et al. | 174/35 R |

*Primary Examiner*—Andrew Faile
*Attorney, Agent, or Firm*—Kirk W. Dailey; John G. Rauch

[57] ABSTRACT

The radio frequency (RF) shielding method uses RF shield clips. The RF shield clips have a base and two walls. The base is shaped to form two stabilizing legs for providing vertical stability. The two walls extend upward from the base, each wall has a portion flanged outward for accepting a portion of a RF shield. Each of the walls has multiple inwardly protruding domes for providing point contact to the RF shield.

14 Claims, 3 Drawing Sheets

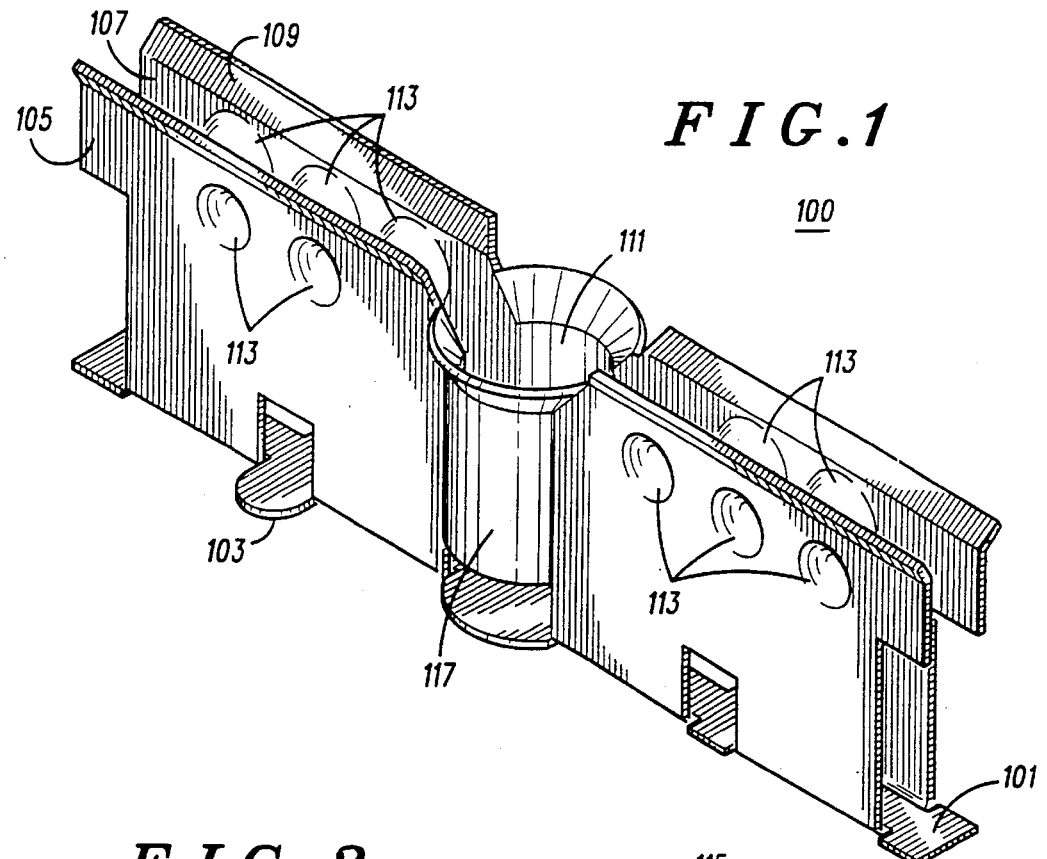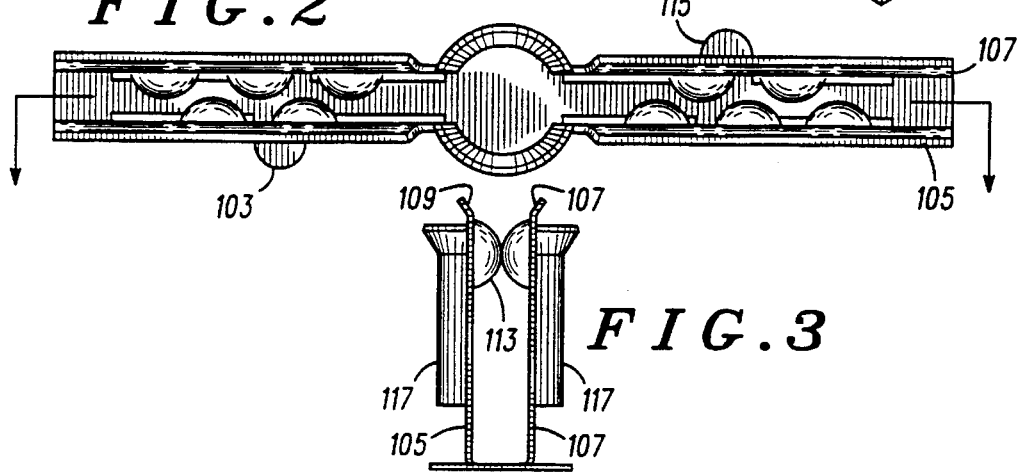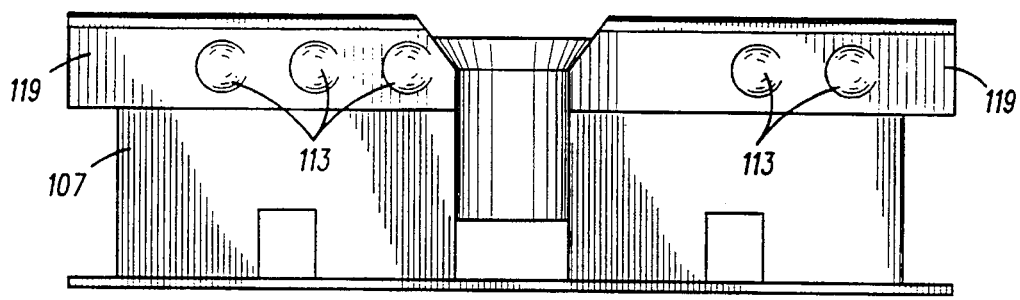

5,577,268

RADIO FREQUENCY SHIELD CLIP SUITABLE FOR USE IN A COMMUNICATION DEVICE

This is a continuation of application Ser. No. 08/023,995, filed Feb. 26, 1993 and now abandoned.

FIELD OF THE INVENTION

The invention generally relates to radio frequency (RF) shields and more specifically to RF shield clips and methods of providing RF shields in radio communication devices.

BACKGROUND OF THE INVENTION

Generally, there are two methods of providing an RF shield for an RF generating component in an electronic device. First, An RF shield is directly soldered to a ground plane of a printed circuit (PC) board around the radio RF generating component. Second, RF shield clips are electrically coupled to the ground plane of the PC board and an RF shield is attached to the RF shield clips.

Directly soldering the RF shield to the ground plane causes several problems, namely: the RF shield needs to be either hand placed and reflow soldered, or hand soldered; and the RF shield becomes permanent, not allowing testing of the RF generating components or other components within the RF shield. These problems increase the cost of the product and decrease the quality and efficiency of manufacturing RF generating devices, such as radio communication devices.

Utilizing RF clips to hold the RF shields, solves some of the aforementioned problems, namely, the shield is typically removable to allow testing of the components within the RF shield. In the past however, the RF shield clips were either hand-placed or placed in a plastic fixture and then reflow soldered. These additional manufacturing steps increase the cost and complexity in the manufacturing process, and also, reduce the efficiency and quality of manufacturing RF generating components. Additionally, RF shield clips often require welding, independent of the soldering step, to provide stability for the RF shield clip.

It would be advantageous to provide a removeable RF shield utilizing autoplaceable, reflow solderable RF shield clips, increasing efficiency and reducing the cost and complexity of manufacturing RF generating components.

BRIEF DESCRIPTION OF THE DRAWINGS

FIG. 1 is an illustration of a perspective view of an RF shield clip in accordance with the present invention.

FIG. 2 is an illustration of a top plan view of an RF shield clip in accordance with the present invention.

FIG. 3 is an illustration of a front elevation view of an RF shield clip in accordance with the present invention.

FIG. 4 is an illustration of a right elevation view of an RF shield clip in accordance with the present invention.

DETAILED DESCRIPTION OF A PREFERRED EMBODIMENT

Figure 5:
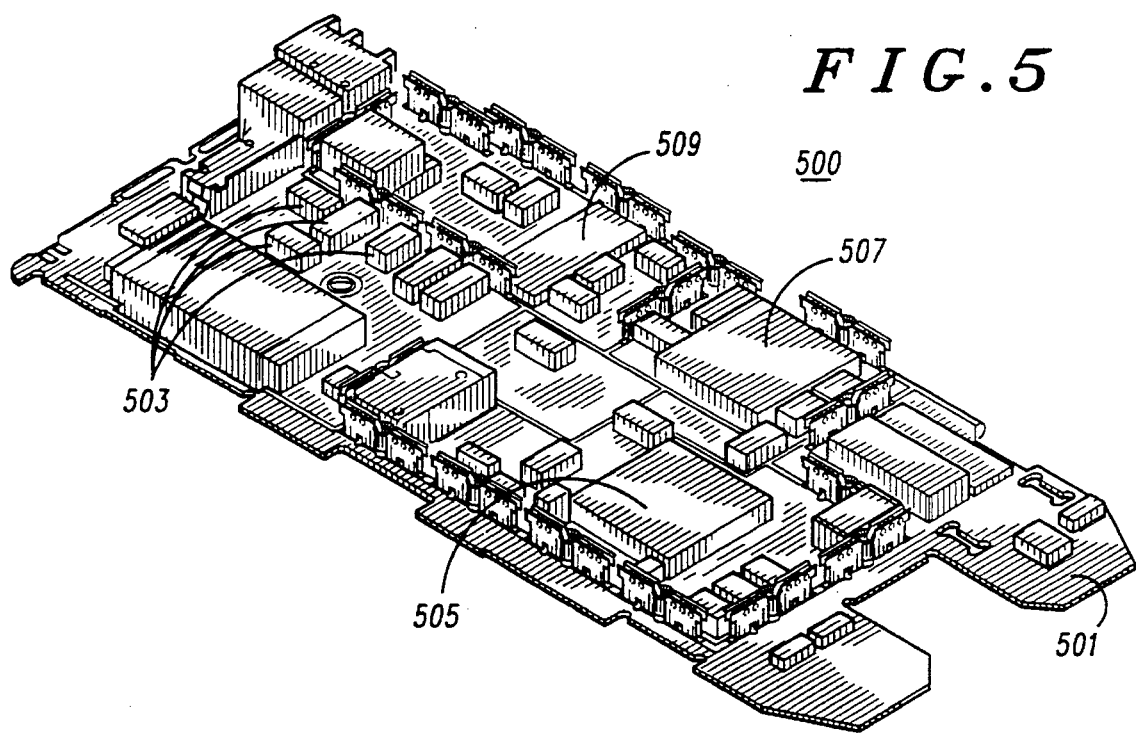
FIG. 5 is an illustration of a radio communication device employed on a printed circuit (PC) board in accordance with the present invention.

The radio communication device illustrated in FIG. 1–FIG. 8 encompasses a preferred embodiment. The radio communication device typically includes RF generating components such as a transmitter and a receiver. RF shields are typically required in radio communication devices to shield the RF energy of the transmitter from the RF energy of the receiver. To provide for testing of the components within the confines of the RF shields, the RF shields are removable. RF shield clips are used to hold the RF shields in place during operation of the radio communication device. The RF shield clips, in this particular embodiment, provide their own stability, also known as autonomous stability, using stabilizing legs. Additionally, the RF shield clips may be placed by auto-place machine and are reflow solderable. In the preferred embodiment, the RF shield dips are made of beryllium copper, the outside walls are plated with tin and there is a gold plated stripe on the inside of the walls to provide superior contact to the RF shield, when the RF shield is inserted.

FIG. 1 is a perspective illustration of a radio frequency (RF) shield clip 100 in accordance with the present invention. The base 101, is shaped to form a stabilizing leg 103 as well as another stabilizing leg 115 visible in FIG. 2. The RF shield clip has two walls 105, 107 extending up from the base 101. The first wall 105, is shaped to form multiple inwardly protruding domes 113. In the preferred embodiment, these domes 113 are stamped from the two walls 105, 107. The multiple domes 113 provide electrical contact to a RF shield placed between the first wall 105 and the second wall 107. Additionally, the first wall has a flanged top portion for easing insertion of the RF shield between the first wall 105 and the second wall 107. The first wall 105, also has a outward curving portion 117, substantially in the center of the first wall 105, such that the first wall 105 and the second wall 107 together form an opening 111 to the base for contact by an auto-placement machine. In the preferred embodiment, the opening 111 has a circular shape to accommodate a particular auto-placement machine. This opening 111 may be shaped to conform to other autoplacement machines. These other shapes include but are not limited to: a rectangle, a square, an octagon, or an oval.

FIG. 2 is an illustration of a top view of the RF shield clip 100. FIG. 2 clearly illustrates the two stability legs 103, 115. These two stability legs 103, 115 are preferred because they provide enough stability for the particular application. Furthermore, different sized and shaped and additional stability legs may also be employed in practicing the present invention.

The second wall 107 is similar to the first wall 105. As illustrated in FIG. 2, the position of the multiple domes 113 of the second wall 107 are opposite and adjacent to the multiple domes 113 of the first wall 105. The domes 113 are adjacent and opposite to ensure contact to the RF shield at four or more points, when the RF shield is inserted. This positioning is preferred to a flat wall which would only guarantee two points of contact. Note that the adjacent placing of the multiple domes 113 is not necessary for the invention, however, this positioning is preferred. The multiple domes 113 of the second wall 107 may be positioned directly opposite the multiple domes 113 of the first wall 105, or any other substantially similar arrangement.

FIG. 3 is a front elevational view of the second wall 107 from the inside the two walls 105, 107. The area indicated by 119 is a gold plated stripe. The gold plated stripe 119 covers the area of the multiple domes 113, providing superior contact between the multiple domes 113 and an RF shield, when the RF shield is in inserted. The first wall 105 also has a gold stripe 119 covering the area of the multiple domes 113.

FIG. 4 is a fight elevational view of the RF shield clip in accordance with the present invention. This figure illustrates the flanged portion 109, the multiple domes 113, the outward curved shape 117 of the first wall 105 and the second wall 107, and the base 101.

FIG. 5 is an illustration of a radio communication device 500 employed on a printed circuit (PC) board 501 which contains an electrical ground plane and multiple electronic components 503. This particular embodiment, is a radiotelephone which has at least three RF generating components which need shielding from each other; namely: the transmitter 505, the receiver 507 and a voltage controlled oscillator 509.

Figure 6:
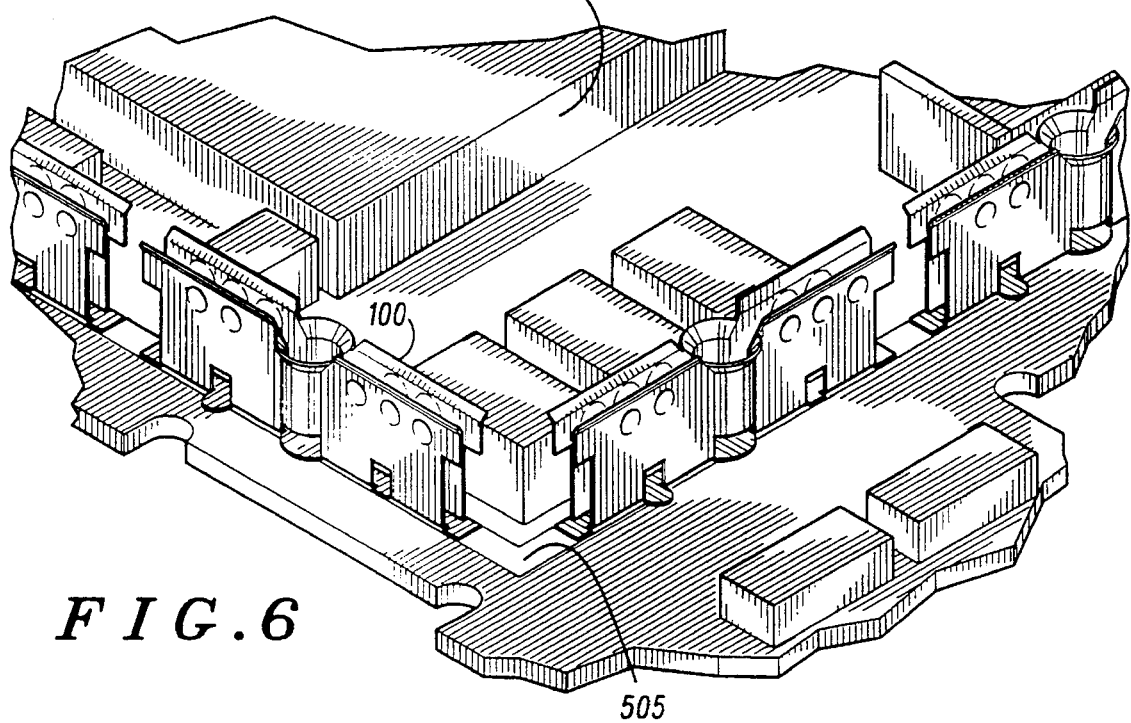
FIG. 6 is an illustration of an exploded view of a portion of FIG. 5.

FIG. 6 is an exploded view of a portion of the radio communication device 500. FIG. 6 illustrates the shielding of the RF generating component 505. The solder pad 513 is coupled to the electrical ground plane of the PC board 501. In the preferred embodiment, solder pad 513 is shaped to the foot print of an RF shield clip 100. The foot print of the RF shield clip 100 is essentially the shape of the base 101 of FIG. 1. Shaping the solder pad 513 to the foot print of the RF shield clip 100, predisposes the RF shield dip 100 to particular orientation during the reflow solder process. The RF shield dip 100 does not require any additional structure to maintaining its position during the reflow solder process because of the stability legs 103 and 115. This is advantageous over what has been done in the past. In the past typically, the RF shield clips had to be hand placed and spot welded or put into a plastic fixture prior to the reflow solder process. By providing the stability legs 103, 115, this is no longer required.

Figure 7:
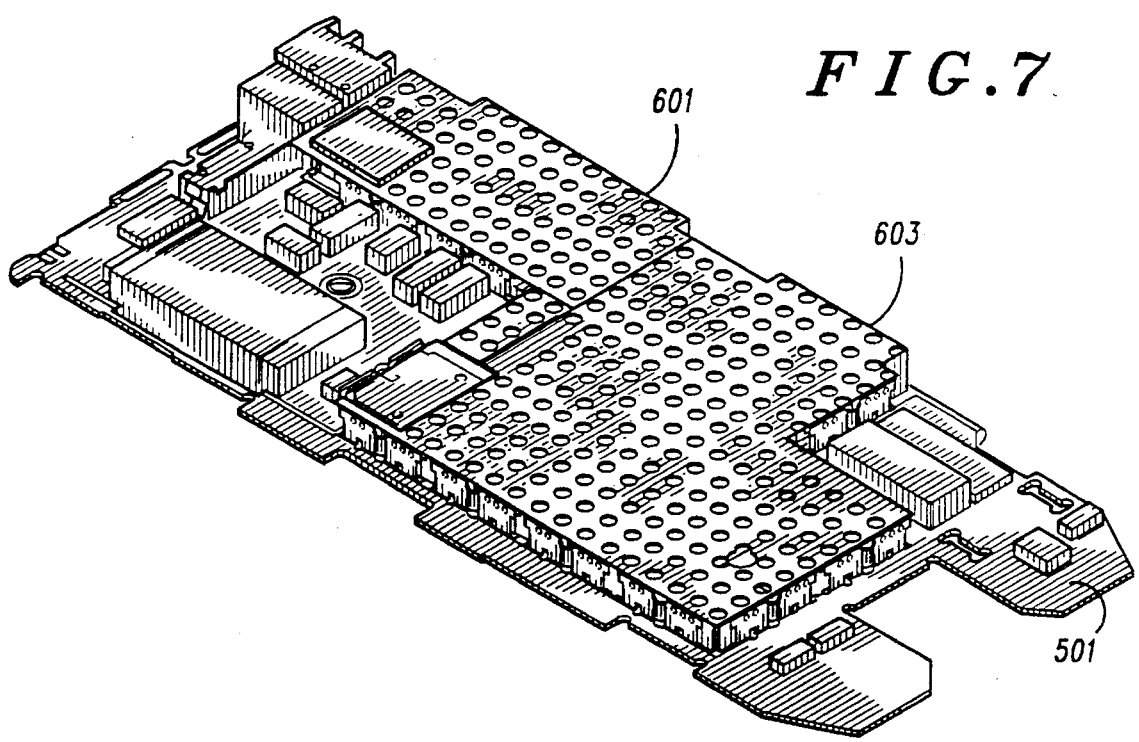
FIG. 7 is an illustration of the radio communication device of FIG. 5 including RF shields in accordance with the present invention.
Figure 8:
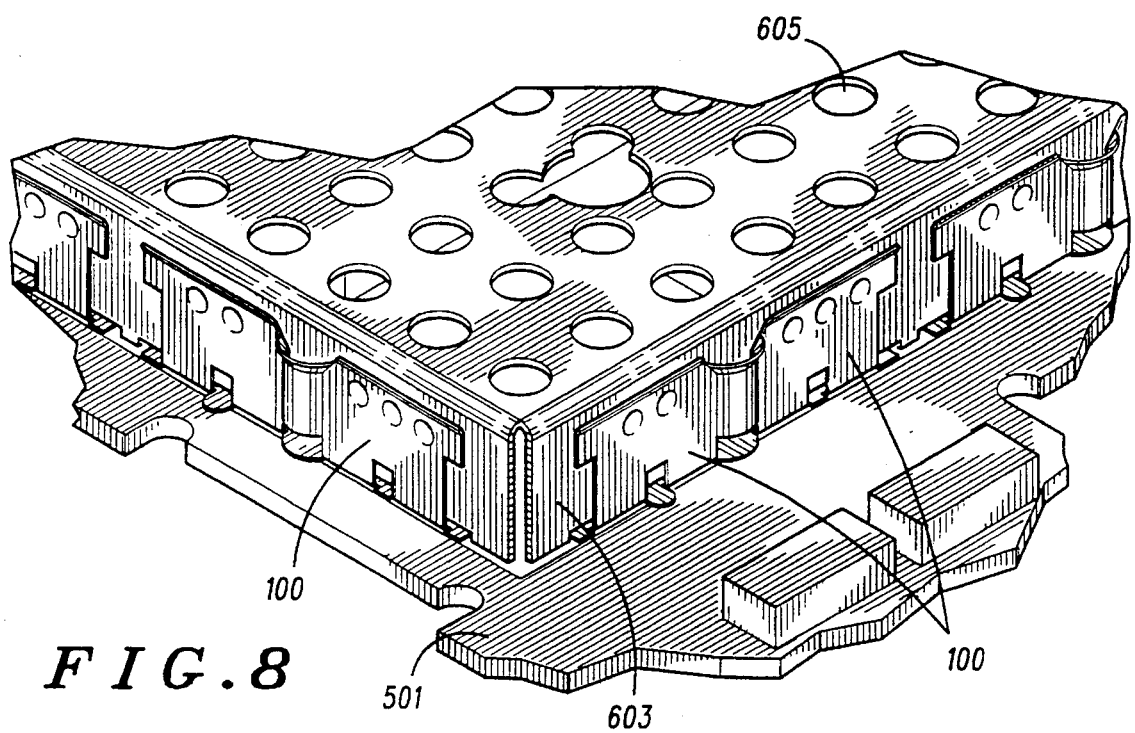
FIG. 8 is an illustration of an exploded view of a portion of FIG. 7.

FIG. 7 illustrates the radio communication device 500 of FIG. 5 after the PC board 501 has been reflow soldered and the pre-formed RF shields 601, 603, have been placed into the RF shield clips 100. FIG. 8 is an exploded view of a portion of the radio communication device 500 illustrated in FIG. 7. Specifically, FIG. 8 illustrates the fit of the RF shields 603 into the RF shield clips 100.

What is claimed is:

1. A radio frequency (RF) shield clip comprising:

a base plate having a hub and at least a first arm and a second arm planarly extending therefrom, the second arm extending in a direction opposite the first arm, the hub having a width greater than each of the widths of the first and the second arms:

a first stabilizing leg coupled to the base plate and extending in a direction substantially perpendicular to the first arm and the second arm and in a plane shared with the base plate, the first stabilizing leg providing vertical stability for the RF shield clip when the base plate of the RF shield clip is rested upon a horizontal surface;

a first wall extending upward from a first side of the base plate, the first wall having a flanged portion flanged outward for accepting a RF shield, the first wall having multiple inwardly protruding domes for providing point contact to the RF shield, the first wall having an outward extending portion defining an opening, the opening providing access to the hub of the base plate; and a second wall extending upward from a second side of the base plate, the second wall having a flanged portion flanged outward in a direction opposite the first wall for accepting the RF shield, the second wall having multiple inwardly protruding domes for providing point contact to the RF shield.

2. A RF shield clip in accordance with claim 1 further comprising a second stabilizing leg coupled to the base plate and extending in a direction substantially perpendicular to the first arm and the second arm and opposite the first stabilizing leg, and in a plane shared with the base plate.

3. A RF shield clip in accordance with claim 1 wherein the multiple domes of the first wall are adjacent to the multiple domes of the second wall.

4. A RF shield clip in accordance with claim 1 wherein the material of the base and the first and the second wall is beryllium copper.

5. A RF shield clip in accordance with claim 1 wherein the outer portions of the base and the first and the second walls are plated with tin.

6. A RF shield clip in accordance with claim 1 wherein the multiple domes of the first and second walls are plated with gold.

7. A radio frequency shield clip in accordance with claim 1 wherein the second wall has an outward extending portion defining an opening, the opening providing access to the hub of the base plate.

8. A radio communication device comprising:

a transmitter generating a first radio frequency (RF) energy;

a receiver generating a second RF energy; and a RF shielding apparatus for shielding the first RF energy from the second RF energy comprising:

a first planar platform having an electrical ground plane and having thereon at least one RF generating device chosen from the receiver and the transmitter;

a pre-formed RF shield;

an RF shield clip having a footprint and comprising:

a base plate having a hub and at least a first arm and a second arm planarly extending therefrom, the second arm extending in a direction opposite the first arm, the hub having a width greater than each of the widths of the first and the second arms;

a first stabilizing leg coupled to the base plate and extending in a direction substantially perpendicular to the first arm and the second arm and in a plane shared with the base plate, the first stabilizing leg providing vertical stability for the RF shield clip when the base plate of the RF shield clip is rested upon the first planar platform, a first wall extending upward from a first side of the base plate, the first wall having a flanged portion flanged outward for accepting the preformed RF shield, the first wall having multiple inwardly protruding domes for providing point contact to the pre-formed RF shield, the first wall having an outward extending portion defining a opening, the opening providing access to the hub of the base plate, and a second wall extending upward from a second side of the base plate, the second wall having a flanged portion flanged outward in a direction opposite the first wall for accepting the pre-formed RF shield, the second wall having multiple inwardly protruding domes for providing point contact to the pre-formed RF shield.

9. A radio communication device in accordance with claim 8 wherein said RF shield clip further comprises a second stabilizing leg coupled to the base plate and extending in a direction substantially perpendicular to the first arm and the second arm and opposite the first stabilizing leg, and in a plane shared with the base plate.

10. A radio communication device in accordance with claim 8 wherein the multiple domes of the first wall are adjacent to the multiple domes of the second wall.

11. A radio communication device in accordance with claim 8 wherein the material of the base and the first and the second wall is beryllium copper.

12. A radio communication device in accordance with claim 8 wherein the outer portions of the base and the first and the second walls are plated with tin.

13. A radio communication device in accordance with claim 8 wherein the multiple domes are plated with gold.

14. A radio communication device in accordance with claim 8 wherein the second wall has an outward extending portion defining an opening, the opening providing access to the hub of the base plate.

\* \* \* \* \*